(12) United States Patent
Liang et al.

(10) Patent No.: US 8,551,802 B2
(45) Date of Patent: Oct. 8, 2013

(54) LASER ANNEALING FOR THIN FILM SOLAR CELLS

(75) Inventors: Haifan Liang, Fremont, CA (US);
Jeroen Van Duren, Palo Alto, CA (US);
Zhi-Wen Sun, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/204,827

(22) Filed: Sep. 12, 2011

(65) Prior Publication Data
US 2013/0065355 A1 Mar. 14, 2013

(51) Int. Cl.
*H01L 21/00* (2006.01)
(52) U.S. Cl.
USPC .......... 438/59; 438/63; 438/87; 438/98; 257/E31.008

(58) Field of Classification Search
USPC ............................................. 438/48–98
See application file for complete search history.

(56) References Cited

U.S. PATENT DOCUMENTS

| | | | | |
|---|---|---|---|---|
| 5,930,606 A * | 7/1999 | McCulloch | | 438/157 |
| 7,019,208 B2 * | 3/2006 | Delahoy | | 136/252 |
| 7,947,599 B2 * | 5/2011 | Chen et al. | | 438/662 |
| 8,252,621 B2 * | 8/2012 | Basol | | 438/93 |
| 8,258,001 B2 * | 9/2012 | Basol | | 438/95 |
| 2009/0320916 A1 * | 12/2009 | Yuan et al. | | 136/256 |
| 2011/0189815 A1 * | 8/2011 | Sager et al. | | 438/95 |
| 2011/0294254 A1 * | 12/2011 | Jackrel et al. | | 438/95 |
| 2012/0040486 A1 * | 2/2012 | Rack | | 438/64 |
| 2012/0100660 A1 * | 4/2012 | Hagedorn et al. | | 438/63 |
| 2012/0288987 A1 * | 11/2012 | Radu et al. | | 438/95 |
| 2012/0318333 A1 * | 12/2012 | Basol | | 136/252 |
| 2012/0325317 A1 * | 12/2012 | Basol | | 136/262 |
| 2013/0109131 A1 * | 5/2013 | Liang | | 438/95 |
| 2013/0122642 A1 * | 5/2013 | Liang | | 438/95 |

OTHER PUBLICATIONS

Removal of Nano Particles on EUV Mask Buffer and Absorber Layers by Laser Shockwave Cleaning 2006 International EUVL SymposiumYoung-Sam Yu1, Tae-Gon Kim1, Sang-Ho Lee1, Jin-GooPark1,Tae-Hoon Kim2, A. Busnaina2and Jong-Myung Lee3 Oct. 16, 2006.*
Pulsed Laser Annealing and Rapid Thermal Annealing of Copper-Indium-Gallium-Diselenide-Based Thin-Film Solar Cells by Xuege Wang; University of Florida 2005.*

* cited by examiner

*Primary Examiner* — Seahvosh Nikmanesh
*Assistant Examiner* — Evren Seven

(57) ABSTRACT

A method for forming copper indium gallium (sulfide) selenide (CIGS) solar cells, cadmium telluride (CdTe) solar cells, and copper zinc tin (sulfide) selenide (CZTS) solar cells using laser annealing techniques to anneal the absorber and/or the buffer layers. Laser annealing may result in better crystallinity, lower surface roughness, larger grain size, better compositional homogeneity, a decrease in recombination centers, and increased densification. Additionally, laser annealing may result in the formation of non-equilibrium phases with beneficial results.

18 Claims, 7 Drawing Sheets

LASER ANNEALING FOR THIN FILM SOLAR CELLS

FIELD OF THE INVENTION

The present invention relates generally to thin film solar cell processing. More specifically, this invention relates to methods of forming copper indium gallium (sulfide) selenide (CIGS) solar cells, cadmium telluride (CdTe) solar cells, and copper zinc tin (sulfide) selenide (CZTS) solar cells using laser annealing techniques.

BACKGROUND OF THE INVENTION

Solar cells have been developed as clean, renewable energy sources to meet growing demand. Currently, crystalline silicon solar cells (both single crystal and polycrystalline) are the dominant technologies in the market. Crystalline silicon solar cells must use a thick substrate (>100 um) of silicon to absorb the sunlight since it has an indirect band gap. Also, the absorption coefficient is low for crystalline silicon because of the indirect band gap. The use of a thick substrate also means that the crystalline silicon solar cells must use high quality material to provide long minority carrier lifetimes to allow the carriers to diffuse to the junction. Therefore, crystalline silicon solar cell technologies lead to increased costs. Thin film solar cells based on amorphous silicon (a-Si), CIGS, CdTe, CZTS, etc. provide an opportunity to increase the material utilization since only thin films (<10 um) are generally required. CdTe and CZTS films have direct band gaps of about 1.5 eV and therefore, are efficient absorbers for wavelengths shorter than about 1100 nm. The absorption coefficient for CdTe is about $10^5$/cm and the absorption coefficient for CZTS is about $10^4$/cm. CIGS films have direct bandgaps in the range of 1.0 eV (CIS) to 1.65 eV (CGS) and are also efficient absorbers across the entire visible spectrum. The absorption coefficient for CIGS is about $10^5$/cm. Additionally, thin film solar cells can be fabricated at the module level, thus further decreasing the manufacturing costs. Furthermore, thin film solar cells may be fabricated on inexpensive substrates such as glass, plastics, and thin sheets of metal. Among the thin film solar cells, CIGS has demonstrated the best lab cell efficiency (above 20%) and the best large area module efficiency (>12%).

The increasing demand for environmentally friendly, sustainable and renewable energy sources is driving the development of large area, thin film photovoltaic (TFPV) devices. With a long-term goal of providing a significant percentage of global energy demand, there is a concomitant need for Earth-abundant, high conversion efficiency materials for use in photovoltaic devices. A number of Earth abundant direct-bandgap semiconductor materials now seem to show evidence of the potential for both high efficiency and low cost in Very Large Scale (VLS) production (e.g. greater than 100 gigawatt (GW)), yet relatively little attention has been devoted to their development and characterization.

Among the TFPV technologies, CIGS and CdTe are the two that have reached volume production with greater than 10% stabilized module efficiencies. Solar cell production volume must increase tremendously in the coming decades to meet sharply growing energy needs. However, the supply of In, Ga and Te may impact annual production of CIGS and CdTe solar panels. Moreover, price increases and supply constraints in In and Ga could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to TFPV using more widely available and more environmentally friendly raw materials should be considered a top priority for research.

The immaturity of TFPV devices exploiting Earth abundant materials represents a daunting challenge in terms of the time-to-commercialization. That same immaturity also suggests an enticing opportunity for breakthrough discoveries. A quaternary system such as CIGS or CZTS requires management of multiple kinetic pathways, thermodynamic phase equilibrium considerations, defect chemistries, and interfacial control. The vast phase-space to be managed includes process parameters, source material choices, compositions, and overall integration schemes. Traditional R&D methods are ill-equipped to address such complexity, and the traditionally slow pace of R&D could limit any new material from reaching industrial relevance when having to compete with the incrementally improving performance of already established TFPV fabrication lines.

However, due to the complexity of the material, cell structure and manufacturing process, both the fundamental scientific understanding and large scale manufacturability are yet to be improved for CIGS and CZTS solar cells. As the photovoltaic industry pushes to achieve grid parity, much faster and broader investigation is needed to explore the material, device, and process windows for higher efficiency and a lower cost of manufacturing process. Efficient methods for forming different types of CIGS and CZTS solar cells that can be evaluated are necessary.

The efficiency of TFPV solar cells depends on many properties of the absorber layer and the buffer layer such as crystallinity, grain size, composition uniformity, density, defect concentration, doping level, surface roughness, etc. Many of these properties may be improved by annealing the layers at high temperatures (i.e. about 600 C-1000 C). However, this is above the melting point of soda lime glass (600 C), a common substrate for thin film solar cells as well as other potential substrates such as plastic sheets.

Therefore, there is a need to develop methods of heating the layers used to fabricate thin film solar cells without degrading the substrate or other layers. There is a need for methods of heating that promote grain growth and decrease the surface roughness. There is a need for methods of heating that decrease the concentrations of defects and vacancies within the layers leading to improved efficiency. There is a need for methods of heating that promote the interdiffusion of layers or dopants to achieve a desired layer composition and structure. There is a need for methods of heating that can be used to remove surface contamination before subsequent processing steps. There is a need for methods of heating that can be used to alter the optical transmission properties of various layers.

SUMMARY OF THE INVENTION

In some embodiments of the present invention, lasers are used to thermally treat one or more layers used in the fabrication of TFPV solar cells. In some embodiments, the laser is a pulsed laser. In some embodiments, the laser is a continuous wave (CW) laser.

In some embodiments of the present invention, lasers are used to anneal the absorber layer of a single-graded CIGS solar cell to enhance interdiffusion of the In and Ga. The laser anneal step may optionally be followed by an $H_2Se$ or Se anneal to fill the Se vacancies. This process would improve the open circuit voltage (Voc) of the solar cell by creating a Ga rich surface layer.

In some embodiments of the present invention, a single-graded CIGS absorber layer is followed by the deposition of a thin layer of In—Ga—Se. This film stack is then annealed using a laser to form a double graded CIGS material. Optionally, this step may then be followed by an $H_2Se$ or Se anneal to fill the Se vacancies. This process would improve the open circuit voltage (Voc) of the solar cell by creating a Ga rich surface layer.

In some embodiments of the present invention, CIGS, CZTS, or CdTe films are printed on a substrate followed by an anneal using a laser. The laser anneal may result in a film with higher density and larger grains.

In some embodiments of the present invention, a Na-free CIGS layer is followed by the deposition of $Na_2Se$. This film stack is then annealed using a laser to incorporate the Na into the underlying CIGS layer in a uniform manner and improve the efficiency of the solar cell.

In some embodiments of the present invention, a laser is used to ablate oxides and excess Na from the surface of a CIGS absorber layer in an inert atmosphere. In some embodiments of the present invention, a laser is used to ablate oxides from the surface of a CZTS absorber layer in an inert atmosphere. The substrate can then be transported into a dry deposition chamber for the deposition of CdS without exposing the substrate to an air ambient. The use of the laser ensures that only the top few nanometers of material are removed.

In some embodiments of the present invention, an anneal step using a laser can be used to activate n-type dopants on a CIGS or CZTS surface to create an inverted n-type layer on the surface. The n-type layer can be important for reducing interface recombination by the formation of a buried homo-junction.

In some embodiments of the present invention, an anneal step using a laser can be used after the deposition of the CIGS, CZTS, or CdTe absorber layer and the CdS buffer layer to improve the optical transmittance of the CdS layer and remove recombination centers at the absorber layer/CdS interface. This step may increase the quantum efficiency and Voc, resulting in increased solar cell efficiency.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu(In_xGa_{1-x})(S_ySe_{2-y})$ where $0 \leq x \leq 1$ and $0 \leq y \leq 2$. As used herein, "CZTS" will be understood to represent the entire range of related alloys denoted by $Cu_2ZnSn(S_ySe_{1-y})_4$ where $0 \leq y \leq 1$.

In FIGS. 1-4 below, a TFPV material stack is illustrated using a simple planar structure. Those skilled in the art will appreciate that the description and teachings to follow can be readily applied to any simple or complex TFPV solar cell morphology. The drawings are for illustrative purposes only and do not limit the application of the present invention.

Figure 1:
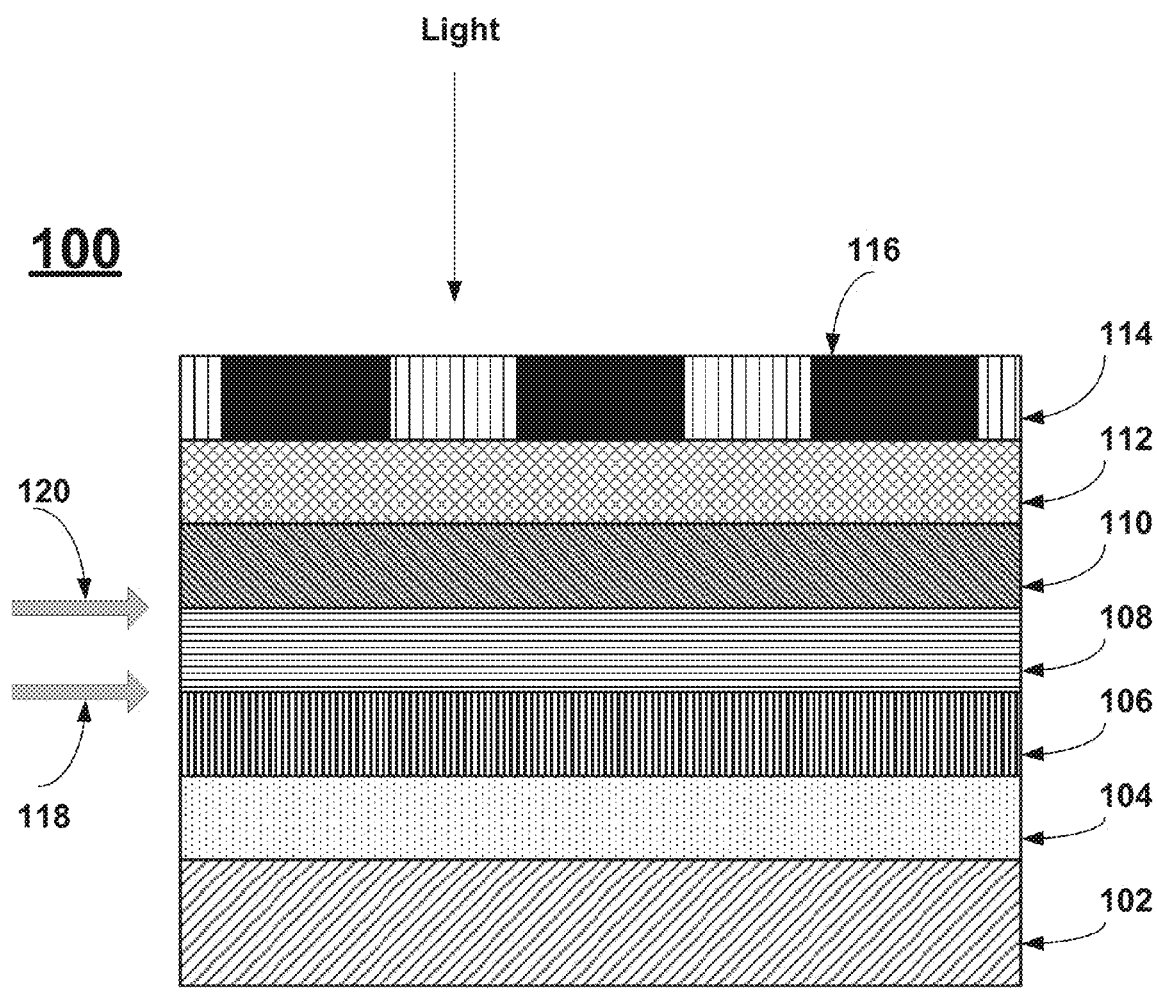
FIG. 1 illustrates a simplified cross-sectional view of a TFPV solar cell stack fabricated in accordance with some embodiments of the present invention.

FIG. 1 illustrates a simple CIGS TFPV material stack, 100, consistent with some embodiments of the present invention. The convention will be used wherein light is assumed to be incident upon the top of the material stack as illustrated. A back contact layer, 104, (typically Mo) is formed on a substrate, 102, (typically soda lime glass (SLG)). The back contact layer is typically between about 0.2 um and 1.0 um in thickness. The back contact layer is typically formed using a physical vapor deposition (PVD) process but may also be formed using an evaporation process. A CIGS absorber layer, 106, is formed on top of the back contact layer. The absorber layer is typically between about 0.5 um and 3.0 um in thickness. The absorber layer may be formed using a variety of techniques such as PVD, co-evaporation, printing or spraying of inks, CVD, etc. Advantageously, the absorber layer is deficient in Cu. The Cu deficiency may be controlled by managing the deposition conditions. Advantageously, a small amount of Na is contained in the absorber layer. The Na may be added by out-diffusion from the SLG substrate or may be purposely added in the form of $Na_2Se$ after the deposition of the absorber layer. Optionally, the absorber layer undergoes a selenization process after formation to fill the Se vacancies within the matrix. The selenization process involves the exposure of the absorber layer to $H_2Se$, Se vapor, or diethylselenide (DESe) at temperatures between about 400 C and 600 C. During the selenization process, a layer of $MoSe_2$ forms at the back contact/absorber layer interface and forms a good ohmic contact between the two layers. A buffer layer, 108, (typically CdS) is then formed on top of the absorber layer.

The buffer layer is typically between about 30 nm and 80 nm in thickness. The buffer layer is typically formed using a CBD technique or by PVD. Optionally, an intrinsic ZnO (iZnO) layer, 110, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to the opaque metal grids used to connect the solar cell to external loads. The iZnO layer makes the TFPV solar cell less sensitive to lateral non-uniformities caused by differences in composition or defect concentration in the absorber and/or buffer layers. The iZnO layer is typically between about 30 nm and 80 nm in thickness. The iZnO layer is typically formed using a reactive PVD technique or CVD technique. A low resistivity top TCO layer, 112, (examples include Al:ZnO (AZO), InSnO (ITO), InZnO, B:ZnO, Ga:ZnO, F:ZnO, F:SnO$_2$, etc.) is formed on top of the iZnO layer. The top TCO layer is typically between about 0.3 um and 2.0 um in thickness. The top TCO layer is typically formed using a reactive PVD technique or CVD technique. An anti-reflection coating (ARC) layer, 114, (typically MgF$_2$) is formed on top of the top TCO layer. The ARC layer increases the efficiency of the TFPV solar cell by reducing the reflection of the incident sunlight. Contained within the ARC layer is an opaque metal grid, 116, (typically Al or Ni:Al). The metal grid is typically between about 0.5 um and 2.0 um in thickness.

Figure 2:
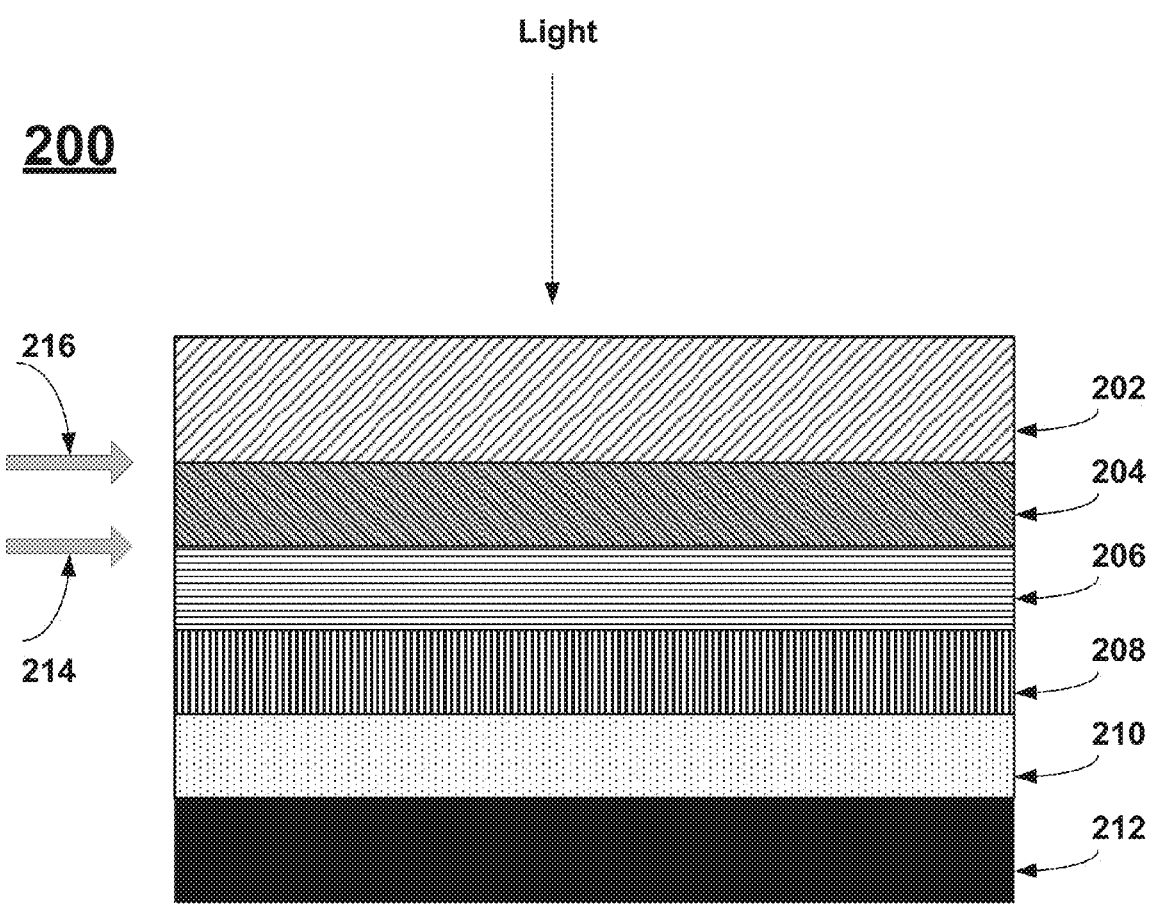
FIG. 2 illustrates a simplified cross-sectional view of a TFPV solar cell stack fabricated in accordance with some embodiments of the present invention.

FIG. 2 illustrates a simple CdTe TFPV material stack, 200, consistent with some embodiments of the present invention. The CdTe TFPV solar cell illustrated in FIG. 2 is shown in a superstrate configuration wherein the glass substrate faces the incident sunlight. The convention will be used wherein light is assumed to be incident upon the top of the material stack as illustrated. The formation of the CdTe TFPV solar cell will be described starting with the glass substrate. A low resistivity bottom TCO layer, 204, (typically ITO) is formed on top of the substrate, 202, (typically SLG). The bottom TCO layer is typically between about 0.5 um and 2.0 um in thickness. The bottom TCO layer is typically formed using a reactive PVD technique or CVD technique. An intrinsic SnO$_2$ layer, 206, is then formed on top of the ITO layer. The SnO$_2$ layer is a high resistivity material and forms part of the transparent conductive oxide (TCO) stack that serves as part of the front contact structure. The SnO$_2$ layer makes the TFPV solar cell less sensitive to lateral non-uniformities caused by differences in composition or defect concentration in the absorber and/or buffer layers. The SnO$_2$ layer is typically between about 0.3 um and 2.0 um in thickness. The SnO$_2$ layer is typically formed using a reactive PVD technique or CVD technique. A buffer layer, 208, (typically CdS) is then formed on top of the SnO$_2$ layer. The buffer layer is typically between about 30 nm and 80 nm in thickness. The buffer layer is typically formed using a CBD technique or PVD technique. A CdTe absorber layer, 210, is formed on top of the buffer layer. The absorber layer is typically between about 0.5 um and 5.0 um in thickness. The absorber layer may be formed using a variety of techniques such as PVD, co-evaporation, printing or spraying of inks, CVD, etc. A back contact layer, 212, (typically Cu:graphite, HgTe, ZnTe:Cu, Te, Cu$_2$Te, As$_2$Te$_3$/Cu, Sb$_2$Te$_3$) is formed on top of the absorber layer. The back contact layer is typically between about 0.3 um and 2.0 um in thickness. The back contact layer is typically formed using a PVD process, evaporation process, or CVD technique.

Figure 3:
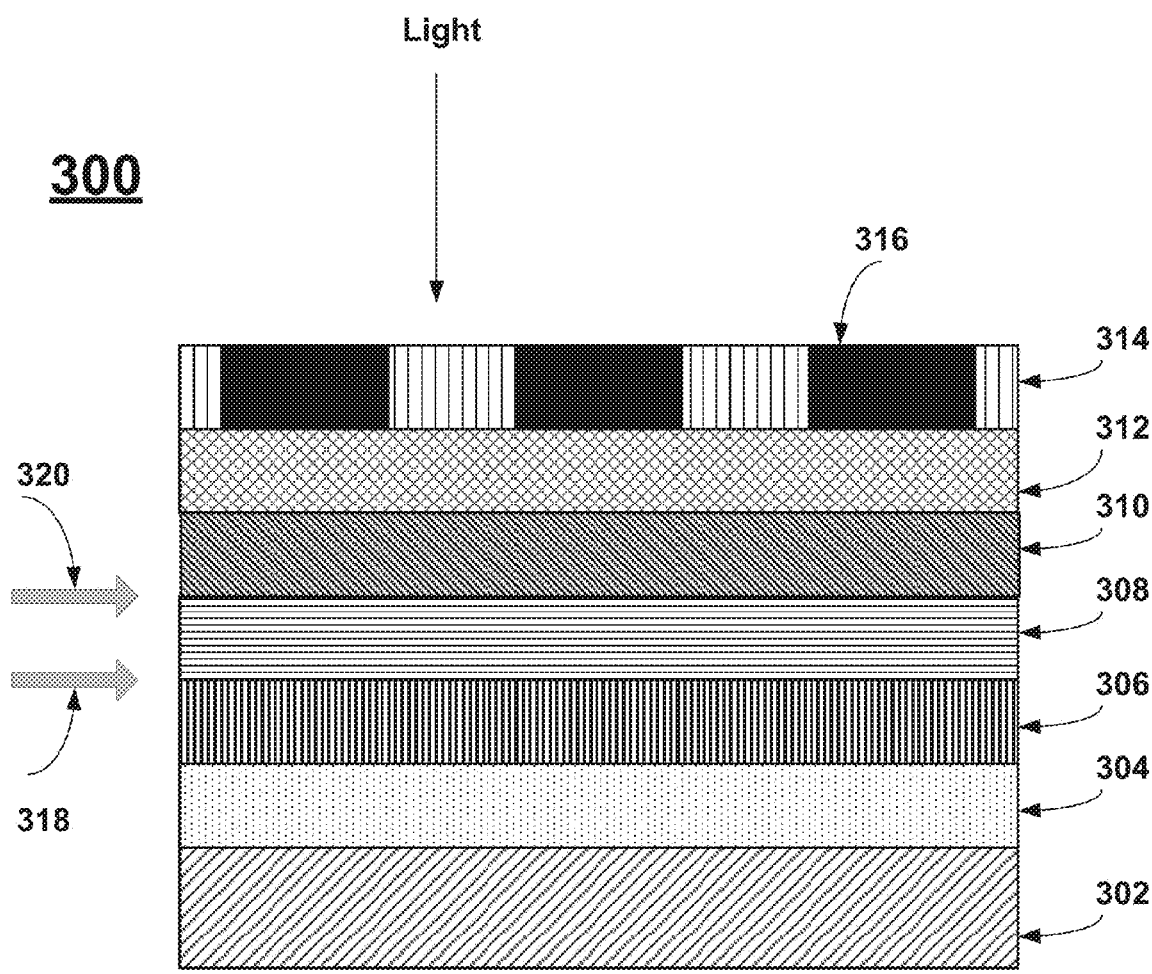
FIG. 3 illustrates a simplified cross-sectional view of a TFPV solar cell stack fabricated in accordance with some embodiments of the present invention.

FIG. 3 illustrates a simple CZTS TFPV material stack, 300, consistent with some embodiments of the present invention. The convention will be used wherein light is assumed to be incident upon the top of the material stack as illustrated. A back contact layer, 304, (typically Mo) is formed on a substrate, 302, (typically SLG). The back contact layer is typically between about 0.2 um and 1.0 um in thickness. The back contact layer is typically formed using a PVD process but may also be formed using an evaporation process. A CZTS absorber layer, 306, is formed on top of the back contact layer. The absorber layer is typically between about 0.5 m and 3.0 um in thickness. The absorber layer may be formed using a variety of techniques such as PVD, co-evaporation, printing or spraying of inks, CVD, sol-gel processing, etc. Advantageously, the absorber layer is deficient in Cu. A buffer layer, 308, (typically CdS) is then formed on top of the absorber layer. The buffer layer is typically between about 30 nm and 80 nm in thickness. The buffer layer is typically formed using a CBD technique or PVD technique. Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to the opaque metal grids used to connect the solar cell to external loads. The iZnO layer makes the TFPV solar cell less sensitive to lateral non-uniformities caused by differences in composition or defect concentration in the absorber and/or buffer layers. The iZnO layer is typically between about 30 nm and 80 nm in thickness. The iZnO layer is typically formed using a reactive PVD technique or CVD technique. A low resistivity top TCO layer, 312, (examples include Al:ZnO (AZO), InSnO (ITO), InZnO, B:ZnO, Ga:ZnO, F:ZnO, F:SnO$_2$, etc.) is formed on top of the iZnO layer. The top TCO layer is typically between about 0.3 um and 2.0 um in thickness. The top TCO layer is typically formed using a reactive PVD technique or CVD technique. An anti-reflection coating (ARC) layer, 314, (typically MgF$_2$) is formed on top of the top TCO layer. The ARC layer increases the efficiency of the TFPV solar cell by reducing the reflection of the incident sunlight. Contained within the ARC layer is an opaque metal grid, 316, (typically Al or Ni:Al). The metal grid is typically between about 0.5 um and 2.0 um in thickness.

Figure 4:
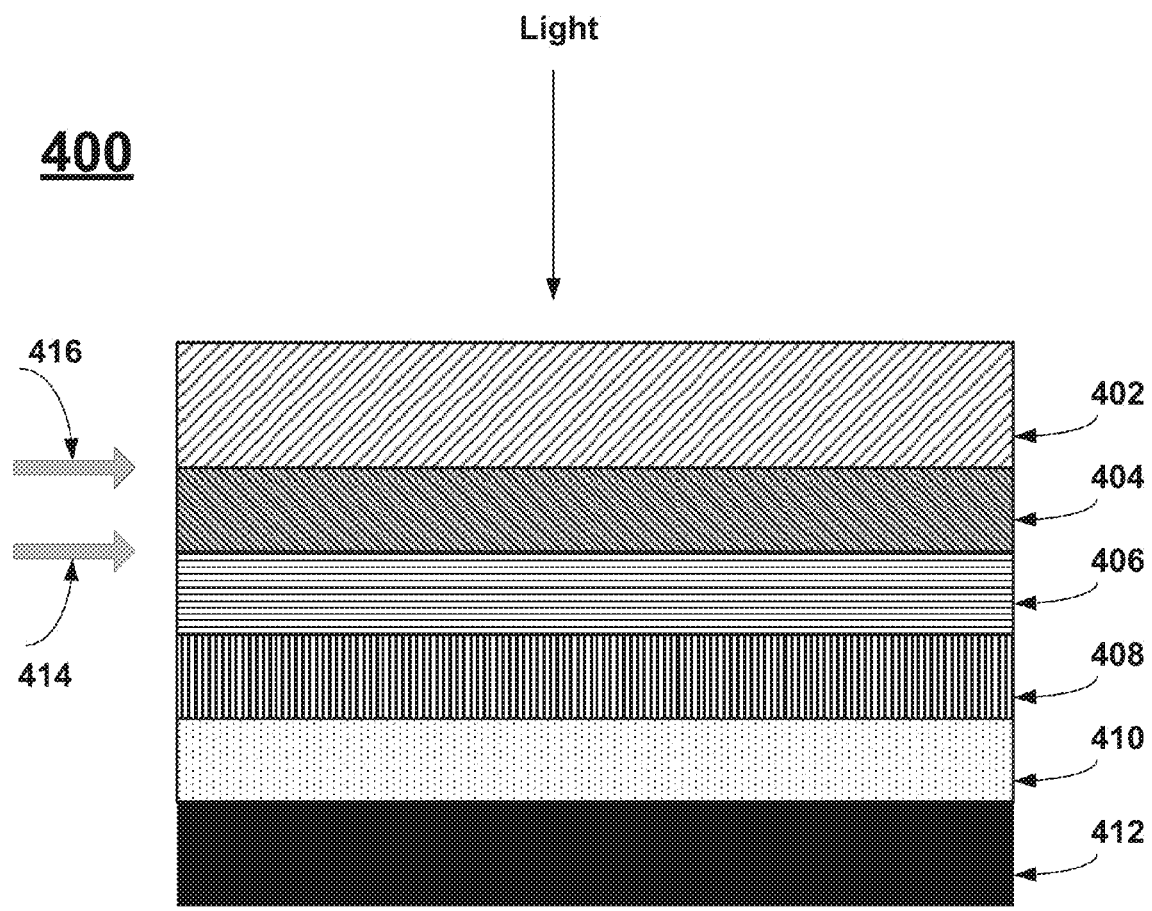
FIG. 4 illustrates a simplified cross-sectional view of a TFPV solar cell stack fabricated in accordance with some embodiments of the present invention.

FIG. 4 illustrates a simple CIGS TFPV material stack, 400, consistent with some embodiments of the present invention. The CIGS TFPV solar cell illustrated in FIG. 4 is shown in a superstrate configuration wherein the glass substrate faces the incident sunlight. The convention will be used wherein light is assumed to be incident upon the top of the material stack as illustrated. The formation of the CIGS TFPV solar cell will be described starting with the glass substrate. A similar structure and similar method would also be applicable to the formation of a CZTS TFPV solar cell fabricated with a superstrate configuration. A low resistivity bottom TCO layer, 404, (typically ITO or AZO) is formed on top of the substrate, 402, (typically SLG). The bottom TCO layer is typically between about 0.3 um and 2.0 um in thickness. The bottom TCO layer is typically formed using a reactive PVD technique or CVD technique. An intrinsic iZnO layer, 406, is then formed on top of the ITO layer. The iZnO layer is a high resistivity material and forms part of the transparent conductive oxide (TCO) stack that serves as part of the front contact structure. The iZnO layer makes the TFPV solar cell less sensitive to lateral non-uniformities caused by differences in composition or defect concentration in the absorber and/or buffer layers. The iZnO layer is typically between about 30 nm and 80 nm in thickness. The iZnO layer is typically formed using a reactive PVD technique or CVD technique. A buffer layer, 408, (typically CdS) is then formed on top of the iZnO layer. The buffer layer is typically between about 30 nm and 80 nm in thickness. The buffer layer is typically formed using a CBD technique or CVD technique. A CIGS absorber layer, 410, is formed on top of the buffer layer. The absorber layer is typically between about 0.5 um and 3.0 um in thickness. The absorber layer may be formed using a variety of techniques such as PVD, co-evaporation, printing or spraying of inks, CVD, etc. A back contact layer, 212, (typically Mo) is formed on top of the absorber layer. The back contact layer is typically between about 0.2 um and 1.0 um in thickness. The back contact layer is typically formed using a PVD process but may also be formed using an evaporation process.

As mentioned previously, many of the electrical and optical properties of the absorber layers and the buffer layers of TFPV solar cells can be improved with heat treatments. However, for isothermal techniques such as furnace treatments or quasi-isothermal techniques such as rapid thermal annealing (RTA), the upper temperature range is limited due to the substrate and other layers present in the device since these techniques heat the entire structure. As an example, soda lime glass has a glass transition temperature between about 550 C and about 600 C and heat treatments of the absorber layers and the buffer layers must be kept well below this threshold.

The high absorption coefficients for CIGS, CdTe, and CZTS make them well suited for laser processing using laser with wavelengths shorter than about 1100 nm. Examples of suitable lasers include semiconductor diode lasers (e.g. AlGaAs/AlGaAs/GaAs: 700-900 nm continuous wave; GaInP/AlGaInP/GaAs: 660-690 nm continuous wave), Nd:YAG (diode-pumped solid state, rod) doubled to 532 nm (pulsed); Nd:YAG (flashlamp) doubled to 532 nm (pulsed); and TiSaph (tunable) (690-1040 nm) (pulsed). These lasers have peak powers up to about 300 kW. Due to the strong absorption, the energy of the laser will be delivered only to the near surface region of the layer (i.e. <0.1 um). Therefore, it should be possible to raise the temperature of the surface to temperatures well above the glass transition temperature of the substrate without damaging the substrate or underlying layers. Furthermore, the laser beam may be focused into a useful shape that can be scanned across the surface of the TFPV module. Examples of such useful shapes comprise circles, rectangles, squares, ovals, etc. Such a system should be able to process the sample at a rate of up to about 10,000 $mm^2/sec$. Due to the long heating and cooling time, furnace anneals can achieve rates of only about 1,000 $mm^2/sec$.

Figure 5:
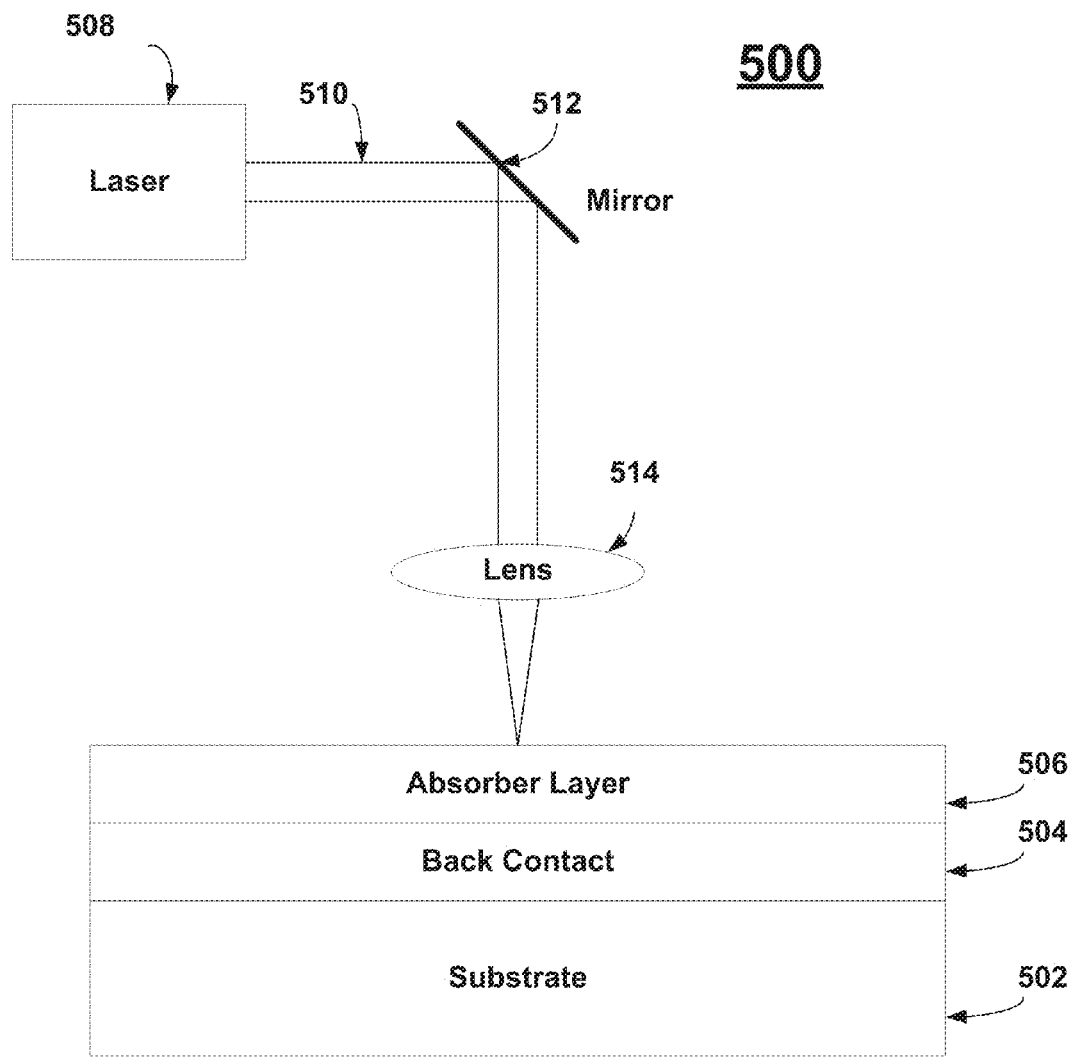
FIG. 5 illustrates a simplified schematic of a laser annealing system in accordance with some embodiments of the present invention.

FIG. 5 illustrates a simplified schematic of a laser annealing system in accordance with some embodiments of the present invention. In FIG. 5, a TFPV solar cell has been partially fabricated by forming a back contact layer, 504, on a substrate, 502. In the case of CIGS or CZTS solar cells, the optional deposition of a $Na_2Se$ layer may have been performed. Illustrated in FIG. 5 is a laser system, 508, that produces a laser beam, 510, that is directed and focused on the surface of the solar cell stack by mirrors, 512, and lenses, 514. The laser system may be pulsed or may be a CW laser system. The laser system is selected such that the energy of the photons is greater than the bandgap of the layer being annealed. In the case of most CIGS, CZTS, and CdTe films, this requires a laser with a wavelength shorter than about 1100 nm. Therefore, any of the laser systems that emit in the visible range are suitable. The laser annealing environment may be vacuum, inert gas, a Se-containing atmosphere, or an S-containing atmosphere. When annealing in an S or Se-containing atmosphere, the annealing step may increase the S or Se concentration in the material and fill S or Se vacancies which improve the efficiency of the solar cell.

Figure 6:
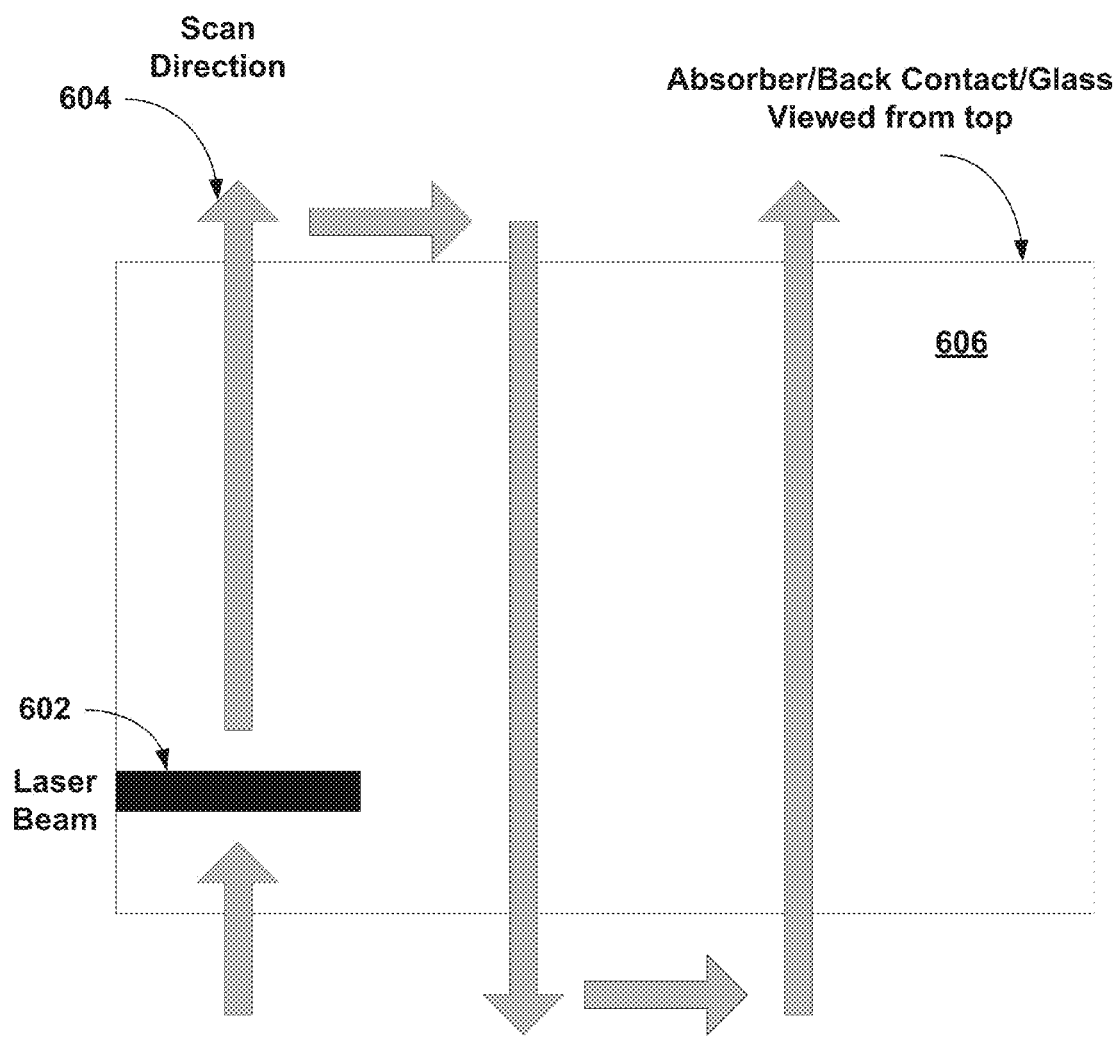
FIG. 6 illustrates a simplified schematic of the use of a laser annealing system in accordance with some embodiments of the present invention.

FIG. 6 illustrates a simplified schematic of the use of a laser annealing system in accordance with some embodiments of the present invention. In FIG. 6, a laser beam has been focused into a rectangular shape as indicated by 602. However, the beam may be of any useful shape as mentioned previously. The laser beam may be caused to scan across the surface of the solar cell stack, 606, as indicated by the arrows, 604. The scanning pattern indicated in FIG. 6 is for illustrative purposes only and is not meant to be limiting. Those skilled in the art will appreciate that the details of the scanning pattern may be adapted to the specific geometry and constraints of the substrate and system being used. Alternatively, the substrate with the back contact and the absorber layer, 606, can be moved and the laser beam would remain stationary.

Figure 7:
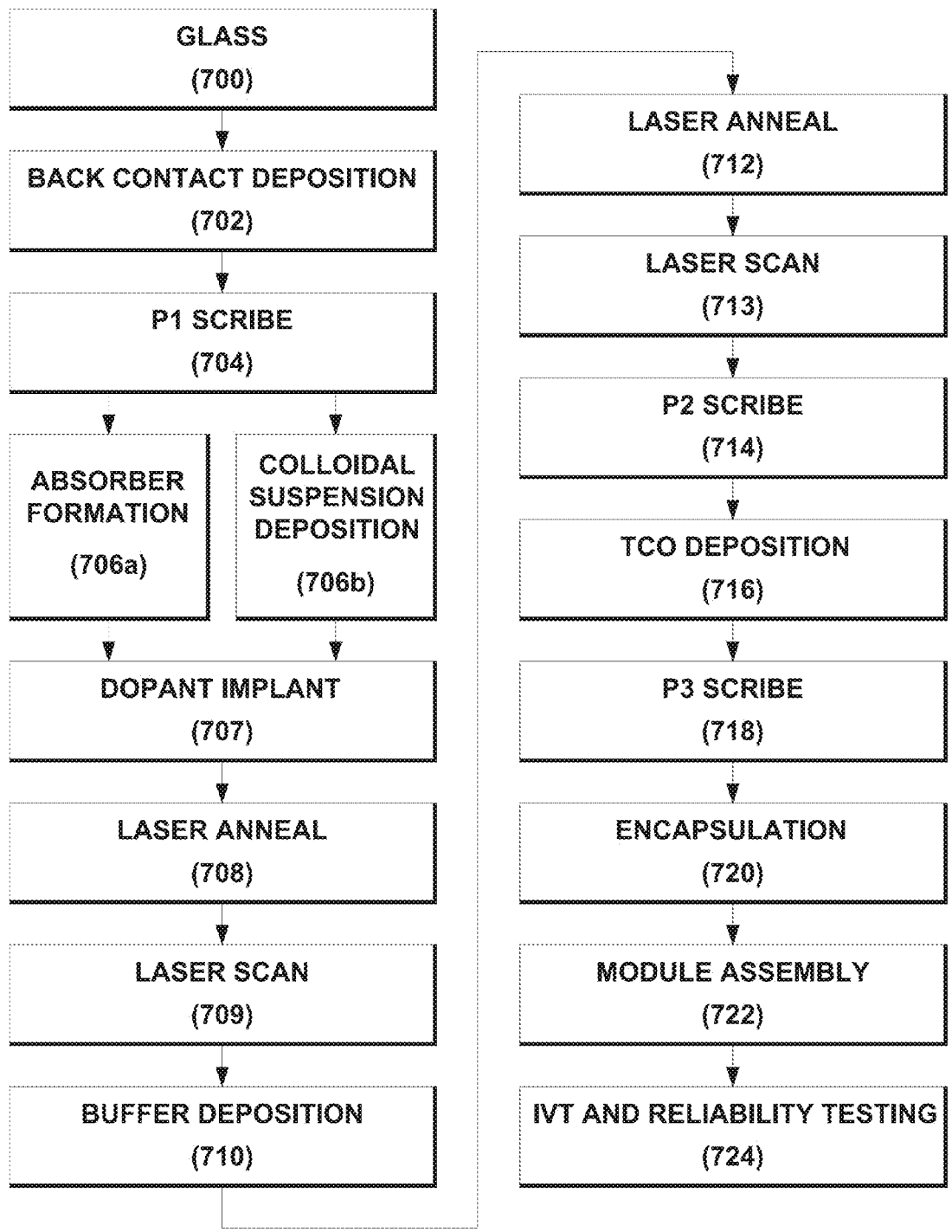
FIG. 7 illustrates a flow chart illustrating a method for fabricating a TFPV solar cell stack, in accordance with some embodiments of the present invention.

FIG. 7 illustrates a flow chart illustrating a method for fabricating a TFPV solar cell stack, in accordance with some embodiments of the present invention. The method will generally describe the process for forming a CIGS or CZTS TFPV solar cell. The method begins with a glass substrate, 700. A back contact layer is formed on the substrate in step 702 as described previously. The back contact is patterned in step 704 in a process commonly known as P1 scribe. This step divides the back contact layer into a plurality of smaller cells on the substrate. In step 706a, the absorber layer is formed on the scribed back contact. The absorber layer may be CIGS or CZTS as discussed previously. Alternatively, in step 706b, a colloidal suspension of particles having the composition of an absorber layer is deposited on the scribed back contact. In step 707, the absorber layer or colloidal suspension of particles having the composition of an absorber layer is implanted with a dopant. In some embodiments, the dopant may be n-type. In step 708, the absorber layer or colloidal suspension of particles having the composition of an absorber layer is annealed using a laser as described previously. In some embodiments, the laser annealing occurs in an atmosphere comprising one of a vacuum, an inert gas, a Se-containing gas, or a S-containing gas. In some embodiments, the laser may be used to improve the compositional homogeneity of the annealed absorber layer and allow non-equilibrium phases to be quenched. In some embodiments, oxide and organic contaminants in the absorber layer formed during the deposition of the colloidal suspension of particles are removed by an etching process. In step 709, a laser beam is focused to a useful shape and scanned across the surface of the absorber layer or colloidal suspension of particles having the composition of an absorber layer. In step 710, the buffer layer is formed on the annealed absorber layer. Typically, the buffer layer is CdS as discussed previously. In step 712, the buffer layer is annealed using a laser as described previously. CdS has an absorption edge at about 600 nm, so laser systems that emit wavelengths less than about 600 nm are advantageous for this step. In some embodiments, the laser annealing occurs in an atmosphere comprising one of a vacuum, an inert gas, a Se-containing gas, or a S-containing gas. In some embodiments, the laser may be used to improve the compositional homogeneity of the annealed buffer layer and allow non-equilibrium phases to be quenched. In step 713, a laser beam is focused to a useful shape and scanned across the surface of the buffer layer. The buffer layer and absorber layers are then patterned in step 714 in a process commonly known as P2 scribe. This step divides the buffer layer and absorber layers into a plurality of smaller cells on the substrate. The scribe pattern for P2 is generally different from the scribe pattern of P1. In step 716, the front contact or TCO layer is formed on the scribed buffer layer. The TCO layer is then patterned in step 718 in a process commonly known as P3 scribe. This step divides the TCO layer into a plurality of smaller cells on the substrate. The scribe pattern for P3 is generally different from the scribe pattern of P1 and P2. This generally completes the formation of the TFPV solar cell stack. In step 720, the substrate and the TFPV solar cell stack are encapsulated to protect the device from environmental elements such as water, dirt, dust, etc. In step 722, the encapsulated substrate is integrated into a frame and other components to for a solar cell module. Finally, in step 724, the solar cell module is tested for performance and reliability.

The use of lasers for the heat treatment of the absorber layer and/or the buffer layer for TFPV solar cells may have a number of benefits. Annealing at high temperature is known to improve the crystallinity of thin films by recrystallizing incomplete reaction phases, removing crystal defects, increasing grain size, increasing the density, and re-orienting the grains. The use of lasers allows the absorber layer and/or the buffer layer to be heated to temperatures close to their melting point without damaging other layers of the structure due to the shallow absorption of the laser beam. Similarly, the surface roughness of the layers will be improved after laser annealing due to enhanced migration of the surface atoms. Laser annealing may be used to improve the compositional homogeneity of the absorber layer and/or the buffer layer due to increased atomic diffusion at the elevated temperatures. The CdTe, CIGS, and CZTS absorber layers are complex, multi-component materials and their optical properties are sensitive to their composition and uniformity. The use of lasers for annealing the absorber layer and/or the buffer layer may allow non-equilibrium phases to be quenched due to the short timescales that are typical of laser materials processing. The expectation is that the laser beam is used to melt a thin film comprised of different phases. In the liquid state, compositions that are not stable under equilibrium conditions can exist. The heat flow out of the material at the end of the laser pulse or after the laser beam has passed (in the case of a CW laser), is fast and may quench the non-equilibrium composition into the solid phase. These compositions may have advantageous properties.

In one example of the use of laser annealing of the absorber layer, a single-graded CIGS absorber layer may be formed on the back contact. In this single-graded scenario, the Ga concentration is non-uniform throughout the layer with the Ga concentration being higher near the absorber/back contact interface. The single-graded CIGS absorber layer may then be laser annealed to enhance the interdiffusion of the In and Ga and optionally followed by a low temperature selenization step. In this example, the laser annealing could improve the open circuit voltage (Voc) and the solar cell efficiency by moving some of the Ga toward the absorber/buffer layer interface. The Voc is improved because the substitution of Ga for In increases the band gap of the material and the Voc scales with the band gap. A similar example may be described for a CZTS absorber layer where Zn or Sn are the materials of interest.

In another example of the use of laser annealing of the absorber layer, a single-graded CIGS absorber layer may be formed on the back contact. This layer is followed by the deposition of a thin layer of In—Ga—Se. This film stack may then be laser annealed to form a double-graded CIGS absorber layer wherein the Ga concentration is higher at both the absorber/back contact interface and at the absorber/buffer layer interface. The double-graded CIGS absorber layer may then be subjected to a low temperature selenization step. More specifically, a precursor layer containing elements such as Ga, Al, Ag, or S can be deposited on the single-graded absorber layer discussed previously. Laser annealing may be used to incorporate these elements in the surface region of the absorber layer to increase the band gap in the depletion region of the device. The depletion region naturally forms at the absorber/buffer layer interface. The laser annealed absorber layer may then be subjected to a low temperature selenization step. The precursor layer may be deposited from solutions. As an example, Ga can be deposited from solutions such as gallium trichloride ($GaCl_3$), gallium acetylacetonate (Ga($Ch_3COCHCOCH_3)_3$), or gallium acetate ($C_6H_9GaO_6$). As discussed previously, the laser annealing may be performed in a Se-containing atmosphere to further improve the efficiency. A similar example may be described for a CZTS absorber layer.

In another example of the use of laser annealing of the absorber layer, a printed CIGS absorber layer may be annealed to increase the density and increase the grain size of the layer. Printed CIGS absorber layers typically utilize formulations, inks, slurries, etc. of small or nanoparticles of the layer composition. Generally, these are colloidal suspensions of the particles. During the synthesis of the particles, the surfaces often contain organic groups and/or oxides phases of the constituents. Typically, the layer is subjected to separate steps to remove the organic and oxide contaminants. Examples of steps that are used include etching in KCN to remove the oxides and annealing in $N_2$ or $H_2$ to remove the organic contaminants. These steps could be followed by laser annealing to increase the density and increase the grain size of the layer by consolidating the nanoparticles. Additionally, the techniques described in the previous examples could be incorporated to form graded layers of CIGS. In some embodiment, the laser annealing step may be used to remove the organic contaminants. A similar example may be described for a CZTS absorber layer.

In another example of the use of laser annealing of the absorber layer, a Na-free absorber layer may be formed on the back contact followed by the deposition of $Na_2Se$ on top of the absorber layer. Laser annealing may be used to incorporate the Na into the absorber layer. The incorporation of a small amount of Na has been found to provide a number of benefits such as improved Voc and improved fill factor, improved grain size and orientation, improved p-type doping, and grain boundary passivation. Additionally, the presence of Na impacts other properties such as metastability, $MoSe_2$ formation, and allows the absorber performance to be maintained across a wider compositional range. A similar example may be described for a CZTS absorber layer.

In another example of the use of laser annealing of the absorber layer, surface oxides and excess Na can be ablated from the surface prior to the deposition of the buffer layer. Advantageously, this process may be performed in a vacuum, $N_2$, or inert atmosphere and the substrate may be transported into the buffer layer deposition without being exposed to air. This may improve the absorber/buffer layer interface by preventing the growth of unwanted oxides. The laser may be used to remove the top few nanometers of the layer by managing the laser power and the scan speed. A similar example may be described for a CZTS absorber layer.

In another example of the use of laser annealing of the absorber layer, n-type dopants can be activated during the laser anneal process. Halogen atoms such as Cl, Br, and I are n-type dopants in CIGS materials. These atoms can be ion implanted into the absorber layer and then activated using a laser anneal process to form an inverted n-type layer. The inverted n-type layer will form a buried homojunction resulting in a reduction in the interface recombination. A similar example may be described for a CZTS absorber layer.

In an example of the use of laser annealing of the buffer layer, the CdS buffer layer may be deposited on the absorber layer. A laser annealing process may then be used to improve the optical transmittance of the buffer layer. The optical transmittance of the buffer layer is higher after the laser annealing. Additionally, laser annealing may lead to a reduction in recombination centers. This may increase the quantum efficiency and increase the Voc of the solar cell.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a thin film solar cell, the method comprising:
   depositing a back contact on a substrate;
   depositing an absorber layer on the back contact, the absorber layer comprising a compound semiconductor having multiple components;
   annealing the absorber layer using a laser;
      wherein the annealing forms non-equilibrium solid phases such that at least one of the multiple components is not uniformly distributed in the in the absorber layer with respect to the remaining components;
      wherein forming the non-equilibrium solid phases comprises forming multiple different liquid phases that are not stable under equilibrium conditions and solidifying the multiple different liquid phases into the non-equilibrium solid phases;
   depositing a buffer layer on the absorber layer after annealing the absorber layer;
   annealing the buffer layer with a laser; and depositing a front contact on the annealed buffer layer after annealing the buffer layer.

2. The method of claim 1, wherein the absorber layer comprises one of CdTe, CIGS, or CZTS.

3. The method of claim 1, wherein the annealing of the buffer layer is performed in an atmosphere comprising one of a Se-containing gas or a S-containing gas.

4. The method of claim 1 wherein the laser is one of a pulsed laser or a continuous wave laser.

5. A method for forming an absorber layer the method comprising:
   depositing a colloidal suspension of particles over a substrate to form the absorber layer, the colloidal suspension comprising a compound semiconductor having multiple components;
   removing oxide and organic contaminants from the absorber layer; and
   annealing the absorber layer with a laser;
      wherein the annealing forms non-equilibrium solid phases such that at least one of the multiple components is not uniformly distributed in the in the absorber layer with respect to the remaining components,
      wherein forming the non-equilibrium solid phases comprises forming multiple different liquid phases that are not stable under equilibrium conditions and solidifying the multiple different liquid phases into the non-equilibrium solid phases.

6. The method of claim 5, wherein the absorber layer comprises one of CIGS or CZTS.

7. The method of claim 5 wherein the laser is one of a pulsed laser or a continuous wave laser.

8. A method for forming an absorber layer of a thin film solar cell, the method comprising:
   depositing an absorber layer, the absorber layer comprising a compound semiconductor having multiple components;
   implanting an n-type dopant into the absorber layer; and annealing the implanted absorber layer with a laser:
      wherein the annealing forms non-equilibrium solid phases such that at least one of the multiple components is not uniformly distributed in the in the absorber layer with respect to the remaining components; and
      wherein forming the non-equilibrium solid phases comprises forming multiple different liquid phases that are not stable under equilibrium conditions and solidifying the multiple different liquid phases into the non-equilibrium solid phases.

9. The method of claim 8 wherein the laser annealed implanted absorber layer comprises one of CIGS or CZTS.

10. The method of claim 8 wherein the laser is one of a pulsed laser or a continuous wave laser.

11. The method of claim 8 wherein the laser has a wavelength shorter than about 1100 nm.

12. The method of claim 1, wherein, after the annealing, the absorber layer has a double graded composition of at least one component forming the absorber layer.

13. The method of claim 12, wherein the absorber layer comprises CIGS and wherein the at least one component having the double graded composition is gallium.

14. The method of claim 1, wherein annealing the absorber layer comprises incorporating one of Ga, Al, Ag, S, or Na into the absorber layer.

15. The method of claim 1, wherein the absorber layer is not exposed to air after annealing the absorber layer and before depositing the buffer layer.

16. The method of claim 1, wherein annealing the absorber layer comprises removing a top portion of the absorber layer.

17. The method of claim 1, wherein annealing the absorber layer comprises activating an n-dopant in the absorber layer.

18. The method of claim 1, wherein annealing the absorber layer improves optical transmittance of the absorber layer.

* * * * *